United States Patent
Arachchige et al.

(10) Patent No.: US 11,566,173 B2
(45) Date of Patent: Jan. 31, 2023

(54) DIRECT-GAP GROUP IV ALLOY NANOCRYSTALS WITH COMPOSITION-TUNABLE ENERGY GAPS AND NEAR-INFRARED PHOTOLUMINESCENCE

(71) Applicant: VIRGINIA COMMONWEALTH UNIVERSITY, Richmond, VA (US)

(72) Inventors: Indika U. Arachchige, Henrico, VA (US); Umit Ozgur, Richmond, VA (US); Denis O. Demchenko, Richmond, VA (US); Venkatesham Tallapally, Richmond, VA (US); Tanner A. Nakagawara, Richmond, VA (US)

(73) Assignee: Virginia Commonwealth University, Richmond, VA (US)

( * ) Notice: Subject to any disclaimer, the term of this patent is extended or adjusted under 35 U.S.C. 154(b) by 149 days.

(21) Appl. No.: 16/981,452

(22) PCT Filed: Mar. 18, 2019

(86) PCT No.: PCT/US2019/022669
§ 371 (c)(1),
(2) Date: Sep. 16, 2020

(87) PCT Pub. No.: WO2019/182934
PCT Pub. Date: Sep. 26, 2019

(65) Prior Publication Data
US 2021/0062084 A1   Mar. 4, 2021

Related U.S. Application Data

(60) Provisional application No. 62/665,729, filed on May 2, 2018, provisional application No. 62/644,646, filed on Mar. 19, 2018.

(51) Int. Cl.
*C09K 11/66* (2006.01)
*B82Y 20/00* (2011.01)
(Continued)

(52) U.S. Cl.
CPC ............ *C09K 11/66* (2013.01); *H01L 51/426* (2013.01); *H01L 51/442* (2013.01);
(Continued)

(58) Field of Classification Search
CPC .......... H01L 31/035218; H01L 51/426; H01L 51/442; H01L 51/447; C09K 11/66; B82Y 20/00; B82Y 40/00
See application file for complete search history.

(56) References Cited

U.S. PATENT DOCUMENTS

2007/0020891 A1   1/2007   Kouvetakis et al.
2017/0218264 A1   8/2017   Klimov et al.

OTHER PUBLICATIONS

Matioszek, Dimitri. Conception de nouvelles espèces divalentes du groupe 14 (Ge, Sn): réactivité et synthèse contrôlée de nano-objets. Diss. Université de Toulouse, Université Toulouse III—Paul Sabatier, 2011. (Year: 2011).*

(Continued)

*Primary Examiner* — Andrew J Golden
(74) *Attorney, Agent, or Firm* — WCF IP

(57) ABSTRACT

Colloidal synthesis of narrowly disperse, near IR emitting Group IV alloy quantum dots with wide range of Sn compositions via reduction of precursor halides is provided, allowing for less-toxic, earth abundant, and silicon-compatible Group IV alloy quantum dots for application in a broad range of electronic and photonic technologies.

16 Claims, 9 Drawing Sheets

(51) Int. Cl.
  *B82Y 40/00* (2011.01)
  *H01L 51/42* (2006.01)
  *H01L 51/44* (2006.01)
(52) U.S. Cl.
  CPC ............ *H01L 51/447* (2013.01); *B82Y 20/00* (2013.01); *B82Y 40/00* (2013.01)

(56) References Cited

OTHER PUBLICATIONS

English machine translation of Matioszek Dissertation: Design of new divalent species of group 14 (Ge, Sn): reactivity and controlled synthesis of nano-objects, Université de Toulouse, Université Toulouse III—Paul Sabatier, 2011 (Year: 2011).*
Codoluto et al, Fundamental aspects of nucleation and growth in the solution-phase synthesis of germanium nanocrystals, CrystEngComm, 2010, 12, 2903-2909 (Year: 2010).*
Lee et al, Colloidal Synthesis of Infrared-Emitting Germanium Nanocrystals, J. Am. Chem. Soc. 2009, 131, 3436-3437 (Year: 2009).*
Esteves; "The Dawn on New Quantum Dots: Synthesis and Characterization of Ge1-xSnx Nanocrystals for Tunable Bandgaps"; Thesis, 2016.
Ho; "Colloidal Synthesis and Optical Characterizations of Semiconductor Nanocrystals from Nontoxic Elements"; Thesis, 2015, entire document.

* cited by examiner

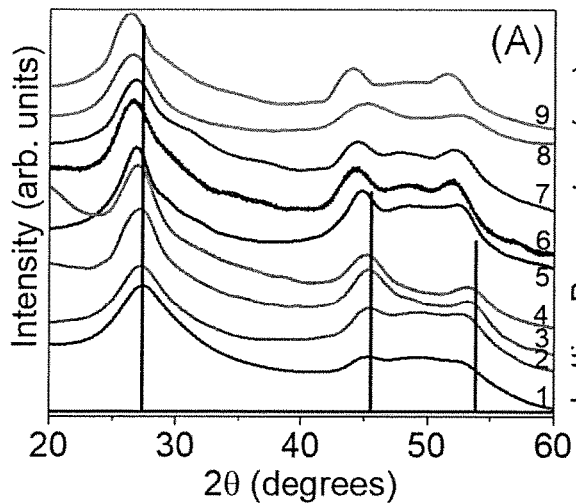
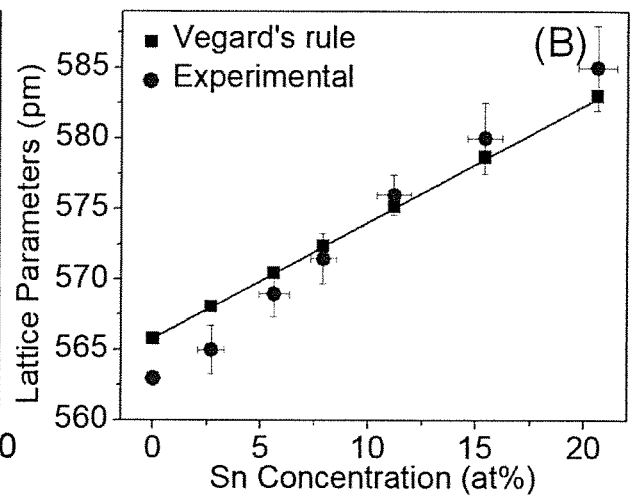
FIG. 3A
FIG. 3B
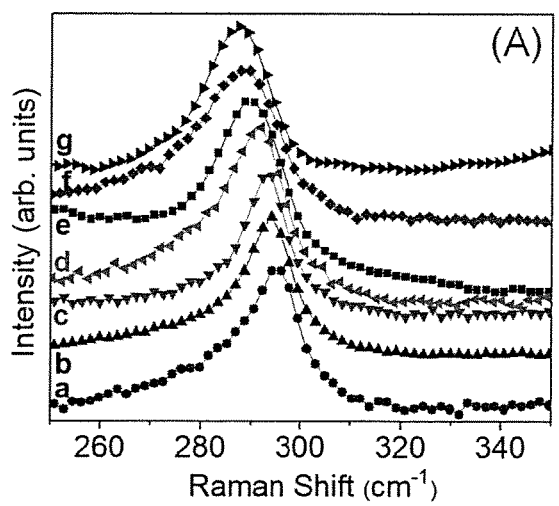
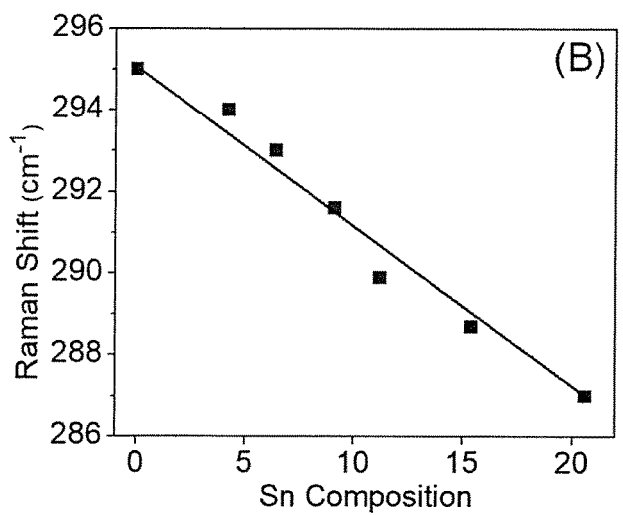
FIG. 4A
FIG. 4B

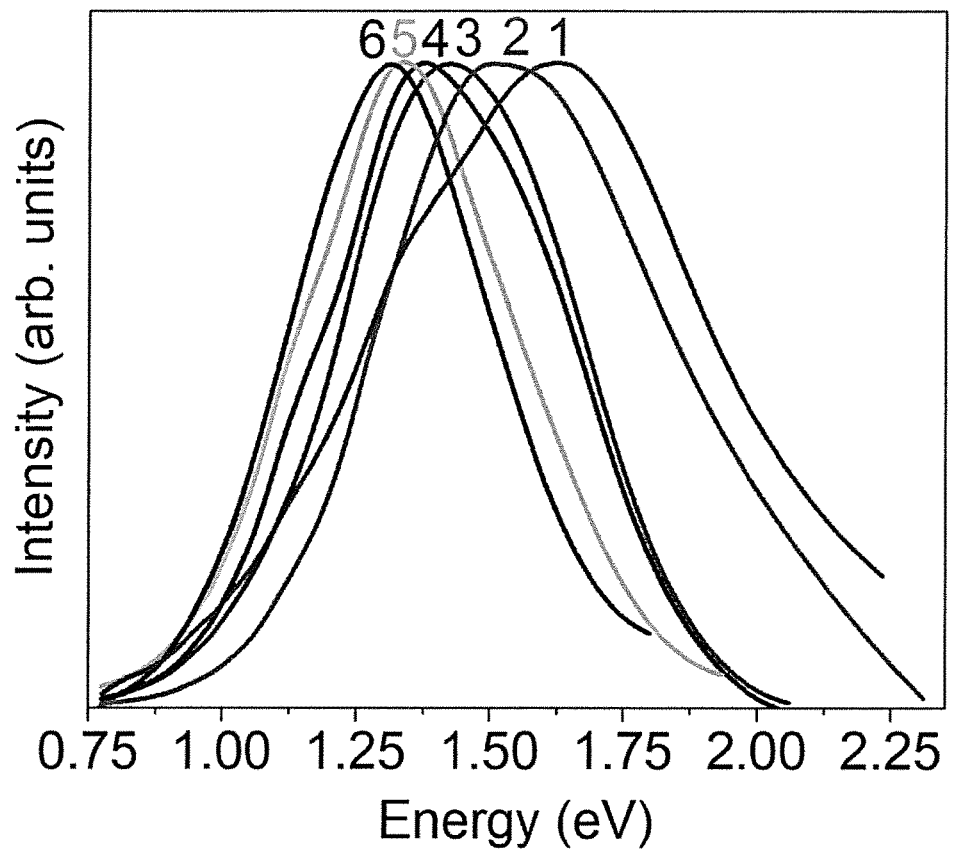
FIG. 9
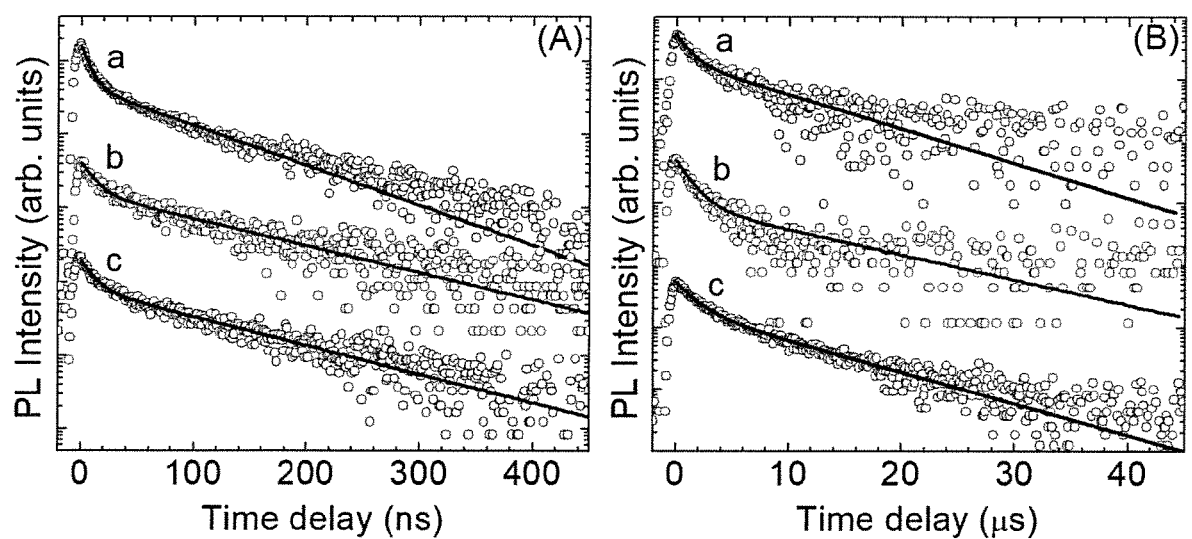
FIG. 10A
FIG. 10B

DIRECT-GAP GROUP IV ALLOY NANOCRYSTALS WITH COMPOSITION-TUNABLE ENERGY GAPS AND NEAR-INFRARED PHOTOLUMINESCENCE

STATEMENT AS TO RIGHTS TO INVENTIONS MADE UNDER FEDERALLY SPONSORED RESEARCH AND DEVELOPMENT

This invention was made with government support under grant no. 1506595 awarded by the National Science Foundation. The government has certain rights in the invention.

FIELD OF THE INVENTION

The invention is generally related to the production of direct energy-gap Group IV alloy quantum dots with extremely high absorption cross-section and high-intensity visible to near IR emission properties.

BACKGROUND OF THE INVENTION

Group-IV semiconductors such as germanium (Ge) and silicon (Si) show immense potential in a number of optical technologies including solar energy conversion, photo-detection, chemical sensing, and imaging.[1-4] However, indirect energy gaps of crystalline Si (1.1 eV) and Ge (0.67 eV) limit their widespread application in optical devices, significantly decreasing the absorption cross section and emission efficiency.[2,3] Thus, a number of different methods, including application of mechanical stress,[5] heteroepitaxial growth,[6-8] and alloying with tin (Sn),[9-11] have been investigated to produce direct gap Group IV semiconductors with promising photophysical properties. Specifically, admixing of α-Sn into crystalline Si and Ge has been shown to decrease the energy of the Γ (direct) valley of conduction band relative to the L (indirect) valley producing direct bandgap $Si_{1-x}Sn_x$ or $Ge_{1-x}Sn_x$ alloys.[8-12] This transition stems from the expansion of cubic Si and Ge structure induced by α-Sn, the diamond-like structural equivalent to Si and Ge.[12] Theoretical and experimental reports suggest an indirect to direct-gap cross over in bulk $Ge_{1-x}Sn_x$ when Sn composition reaches 6.3-11%.[16-15] In addition, incorporation of Sn enhances the electron and hole mobility, making direct-gap $Ge_{1-x}Sn_x$ alloys promising candidates for high speed optoelectronics.[16,17] Unfortunately, the fabrication of homogeneous alloys has proven difficult, because of large discrepancies (~14-19%) in lattice constants and much higher cohesion energies of Si and Ge compared to that of α-Sn.[18] Moreover, the admixture of α-Sn (bandgap ($E_g$)=0.08 eV) significantly reduces the energy gaps (0.35-0.80 eV for x=15.0-0.00%)[19] and promotes the metallic character of direct-gap $Ge_{1-x}Sn_x$ alloys, eliminating any potential application in visible to near IR optoelectronics.

To promote direct-gap behavior and expand the optical range, quantum confinement effects have been utilized to produce low-dimensional nanostructures of $Ge_{1-x}Sn_x$ alloys.[20-24] Quantum dots (QDs) and nanowires (NWs) of $Ge_{1-x}Sn_x$ have been reported both at strongly-confined and weakly-confined size regimes that promote wider direct energy gaps from visible to near IR spectrum.[17,20-27] The colloidal synthesis of $Ge_{1-x}Sn_x$ alloy QDs with varying sizes (~2-23 nm) and Sn compositions (x=0-28%) has been reported.[20] The larger $Ge_{1-x}Sn_x$ alloys (15-23 nm) exhibit minimum or no confinement effects and absorption energy gaps (0.2-0.4 eV) that are red-shifted from bulk Ge, similar to those reported for bulk $Ge_{1-x}Sn_x$ thin film alloys. In contrast, smaller $Ge_{1-x}Sn_x$ alloy QDs (~2-5 nm) show strong confinement effects with composition-tunable absorption onsets and visible PL, exclusively for ultra-small QDs (1.8-2.2 nm).[20-23,28] A recent theoretical study suggests that admixture of α-Sn into Ge significantly increases the oscillator strengths, with the potential to produce brightly emissive QDs with high molar absorptivity and photoluminescence (PL) efficiency.[28] Nonetheless, size- and composition-dependent PL properties of near IR emitting $Ge_{1-x}Sn_x$ QDs have not been properly quantified to date, owing in part to high polydispersity of as-synthesized particles and significantly low PL quantum yields.[20] More recently, inorganic passivation of $Ge_{1-x}Sn_x$ QDs has been attempted to produce $Ge_{1-x}Sn_x$/CdS core/shell QDs.[24] However, resultant alloys exhibit broad-band IR PL with no size (8-13 nm) or composition (x=5-25%) dependent tunability. As such, the synthesis of $Ge_{1-x}Sn_x$ alloys with enhanced near IR absorption and tunable near IR PL has proven a challenging task to further expand the optical window of direct-gap and silicon-compatible Group IV alloys.

SUMMARY OF THE INVENTION

An aspect of the present invention provides a colloidal synthesis of narrowly disperse, near IR emitting Group IV alloy QDs with a wide range of Sn compositions. An embodiment of the invention provides a method of forming quantum dots comprising an alloy of a Group IV semiconductor and tin (Sn), comprising the steps of: reacting a halide precursor of the Group IV semiconductor with a halide precursor of Sn in the presence of a solvent to produce a solution comprising a complex between the Group IV semiconductor and Sn, adding a reducing agent to the solution, and heating the solution to a temperature suitable to form said quantum dots. In some embodiments, the Group IV semiconductor is germanium (Ge) or silicon (Si). In some embodiments, the halide precursor of the Group IV semiconductor is $GeI_2$ or $SiI_4$. In some embodiments, the halide precursor of Sn is $SnCl_2$. In some embodiments, the solvent is an alkene or alkylamine solvent, such as hexadecylamine or oleylamine. In some embodiments, prior to the reacting step, the solvent is pre-heated to a temperature of at least 115° C. for at least one hour and then cooled to room temperature. In some embodiments, the step of reacting is carried out at a temperature of at least 115° C. for at least one hour. In some embodiments, the reducing agent is an alkyllithium compound. In some embodiments, the solution is heated to at least 230° C. prior to the adding step. In some embodiments, the temperature suitable to form quantum dots is at least 300° C. In some embodiments, the method further comprises the step of recovering the quantum dots by methanol precipitation.

Another aspect of the invention provides quantum dots formed by a method as disclosed herein. In some embodiments, the quantum dots are 2-6 nm in size and have a size dispersity of 6-15%. In some embodiments, the quantum dots have a Sn composition from 1.5-20.6%. In some embodiments, the quantum dots have composition-tunable absorption onsets of 1.72-0.84 eV and photoluminescence peaks of 1.62-1.31 eV.

Another aspect of the invention provides a nanocrystal thin film and a solar cell comprising quantum dots formed by a method as disclosed herein.

BRIEF DESCRIPTION OF THE DRAWINGS

FIGS. 3A-B. (A) PXRD patterns of $Ge_{1-x}Sn_x$ alloy QDs with varying Sn compositions: (1) x=1.5%, (2) x=2.7%, (3) x=5.6%, (4) x=6.4%, (5) x=7.9%, (6) x=9.1%, (7) x=11.2%, (8) x=15.4%, and (9) x=20.6%. The ICDD-PDF overlay of diamond cubic Ge (JCPDS #01-089-5011) is shown as vertical lines. (B) A plot illustrating the variation of experimental (obtained from PXRD analysis) and theoretical (calculated using Vegard's rule) lattice parameters of selected QDs as a function of Sn composition. Experimental lattice parameters and Sn compositions were obtained from analysis of 3-5 individually prepared samples.

FIGS. 4A-B. (A) Raman spectra of the $Ge_{1-x}Sn_x$ alloy QDs with varying Sn compositions: (a) x=0.00%, (b) x=4.2%, (c) x=6.4%, (d) x=9.1%, (e) x=11.2%, (f) x=15.4%, and (g) x=20.6%. (B) A plot illustrating the systematic red-shifting of Ge-Ge optical phonon mode with increasing Sn composition.

FIGS. 5A-F. Representative low-resolution TEM images of $Ge_{1-x}Sn_x$ alloy QDs with varying Sn composition: (A) x=1.5%, (B) x=5.6%, (C) x=7.9%, (D) x=11.2%, (E) x=15.4%, (F) x=20.6%. The insets in C and D show the high resolution TEM images of the selected QDs.

FIG. 9. Room-temperature solid-state photoluminescence spectra of $Ge_{1-x}Sn_x$ alloy QDs with varying Sn compositions: (1) x=1.5% (1.62 eV), (2) x=1.9% (1.52 eV), (3) x=2.7% (1.43 eV), (4) x=3.4% (1.38 eV), (5) x=4.2% (1.34 eV), and (6) x=5.6% (1.31 eV). Corresponding PL peak maxima are shown in parentheses.

FIGS. 10A-B. PL transients at (A) 295 K and (B) 15 K for $Ge_{1-x}Sn_x$ alloy QDs with varying Sn compositions: (a) x=1.9%, (b) x=4.2%, and (c) x=5.6%. The solid lines are biexponential fits.

DETAILED DESCRIPTION

Figure 1A:
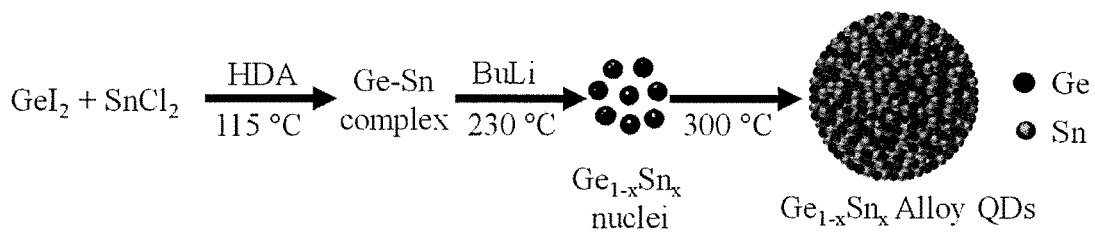
FIGS. 1A-B. An illustration of the synthesis of near-infrared emitting (A) $Ge_{1-x}Sn_x$ alloy QDs and (B) $Si_{1-x}Sn_x$ alloy QDs according to an exemplary embodiment of the disclosure.

Quantum dots (QDs), also referred to herein as nanocrystals, are tiny semiconductor particles (e.g. a few nanometers in size), having optical and electronic properties that differ from larger LED particles. Many types of QD, when excited by electricity or light, emit light at frequencies that can be precisely tuned by changing the dots' size, shape, and material, enabling myriad applications in, for example, optoelectronic devices.

Both absorption onset and fluorescence emission of QDs can be tuned by changing the size of the QD during its synthesis. The larger the dot, the redder (lower energy) its absorption onset and fluorescence spectrum. Conversely, smaller dots absorb and emit bluer (higher energy) light. To improve fluorescence quantum yields, QDs can be made with "shells" of a larger bandgap semiconductor material around them.

Indirect-gap Group IV semiconductors, such as Si and Ge, are those in which the valence band maximum occurs at a different point in momentum space than the conduction band minimum. Consequently, their inter-band electronic transitions require interaction with a phonon (quantized lattice vibration), where phonon momentum accounts for the difference in wave vector. Such complex electronic structure makes the photoexcitation (absorption) and radiative relaxation (emission) extremely inefficient relative to those of a direct-gap semiconductor. The expense of Si and Ge in a number of optical technologies (solar cells, light emitting diodes, optical detectors and sensors) stems from the need for thick, defect-free crystals to overcome this inefficiency. To address this issue, described herein are a novel class of Group IV alloy nanostructures that exhibit both size- and composition-tunable direct energy gaps throughout the visible to near IR spectrum for high-efficiency, silicon-compatible, electronic and photonic devices. Moreover, by employing wet-chemical synthesis, this has been achieved at low-cost, and resulted in solution-processible nanocrystals that are amenable for a range of low-cost, post-synthetic processing techniques.

Described herein is the colloidal synthesis of narrowly disperse, near IR emitting, direct-gap, Group IV alloy (e.g., $Ge_{1-x}Sn_x$ and $Si_{1-x}Sn_x$) QDs with a wide range of Sn compositions. The absorption energy gaps may be tuned over a wide spectral region for narrowly disperse QDs. The synthesized alloy QDs may exhibit intense near IR emissions and a clear red shift in PL energy with increasing Sn composition. The alloy QDs may also exhibit a temperature dependence of carrier dynamics which suggests clearly distinguishable contributions from dark and bright excitons as well as the interplay between surface traps and core electronic states. Colloidal synthesis provides a unique platform to incorporate significant Sn into, for example, Ge without altering its diamond cubic structure and simultaneously expanding the energy gaps owing to unique size confinement effects.

During colloidal synthesis of QDs, the product neither precipitates as a bulk solid nor remains dissolved. When the solution is heated to a high temperature, the precursors decompose forming monomers which then nucleate and generate nanocrystals. The temperature must be high enough to allow for rearrangement and annealing of atoms during the synthesis process while being low enough to promote crystal growth.

Figure 1B:
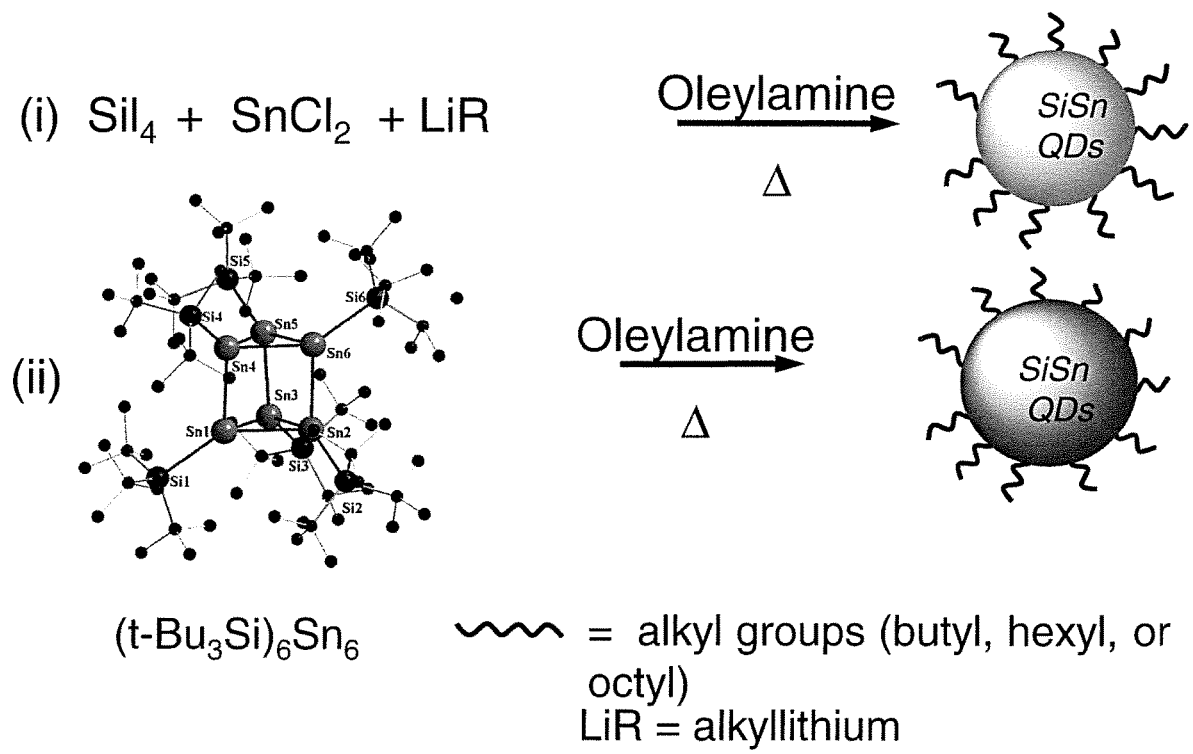
Figures 2A, 2B, 2C, 2D, 2E, 2F, 2G, 2H, 2I:
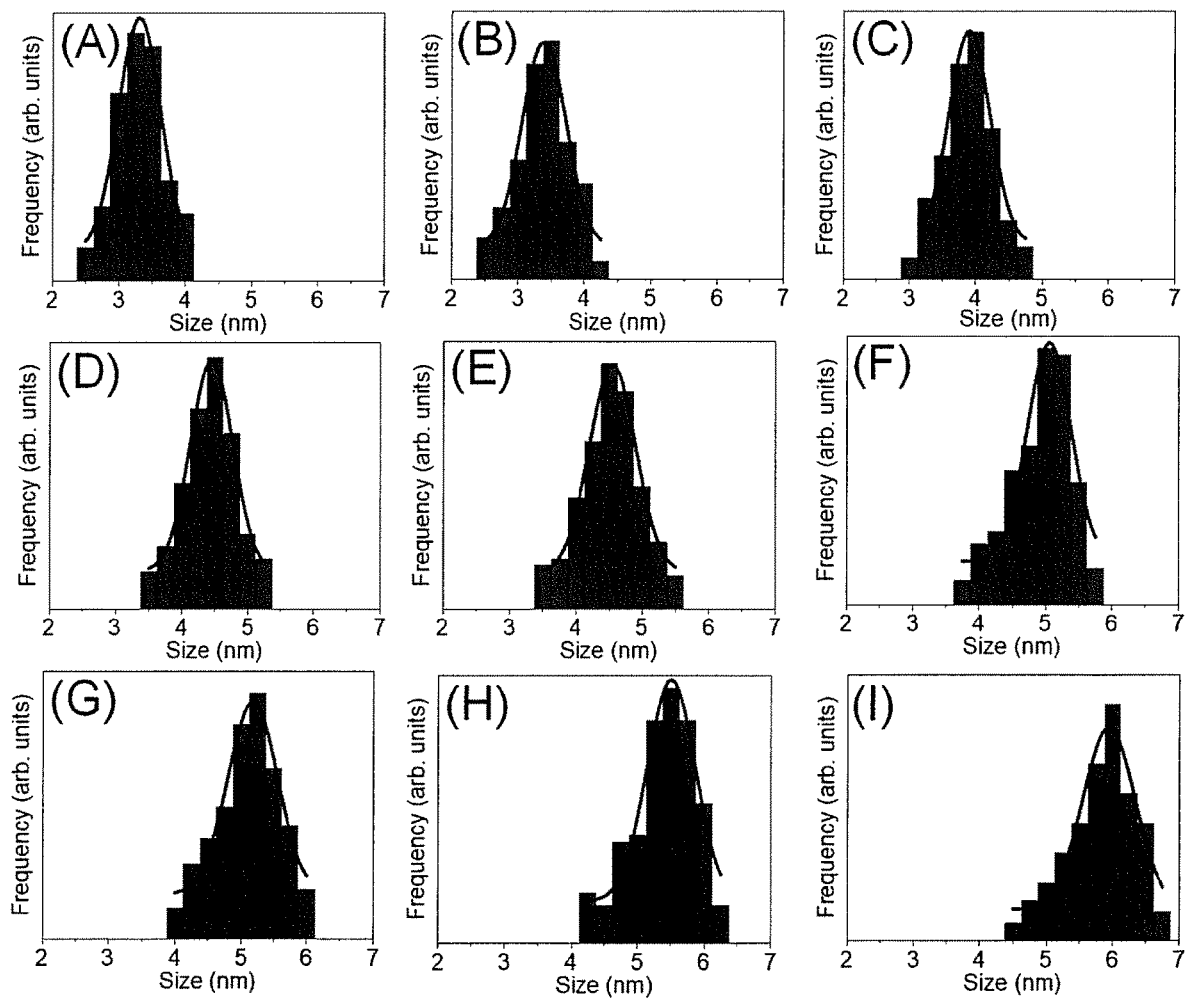
FIGS. 2A-I. Size histograms of $Ge_{1-x}Sn_x$ alloy QDs with varying Sn composition: (A) x=1.5%, (B) x=2.7%, (C) x=4.2%, (D) x=5.6%, (E) x=7.9%, (F) x=9.1%, (G) x=11.2%, (H) x=15.4%, and (I) x=20.6%.

With reference to FIGS. 1A-B, Group IV alloy (e.g. $Ge_{1-x}Sn_x$ or $Si_{1-x}Sn_x$) nanocrystals may be synthesized by co-reduction of halide precursors (e.g. $GeI_2$, $SnCl_2$, and $SiI_4$) in high boiling alkene and alkylamine solvents. High boiling alkene and alkylamine solvents typically have a boiling point greater than about 330-360° C. Any halide, e.g. chloride, fluoride, bromide, and iodide may be incorporated into the precursor. In an exemplary synthesis of nanocrystals, the alkene or alkylamine solvent, such as octadecene or hexadecylamine, is degassed under vacuum at about 100-150° C., e.g. about 115° C. for at least about 30 minutes, e.g. for 1 hour. Other suitable solvents include, but are not limited to, dodecylamine and oleylamine. Some solvents, such as hexadecylamine, act as a surfactant.

After cooling to room temperature (between about 20 to 25° C.), appropriate amounts of $SiI_4$ or $GeI_2$ and $SnCl_2$, 0.6 mmol of metal total, are combined with the solvent. This mixture is then degassed as before to produce a homogeneous orange color solution. Then the reaction is flushed with nitrogen (e.g. for at least about 10-15 min) and the temperature is raised to about 200-260° C., e.g. 230° C., at which point about 0.25-1 mmol, e.g. about 0.58-0.75 mmol, of a reducing agent in a solvent such as 1-octadecene (ODE) is swiftly injected. Suitable reducing agents include, but are not limited to an akyllithium compound such as butyllithium (BuLi), hexyllithium, methyllithium, or octyllithium.

Typically, the injection causes a temperature drop, e.g. to about 209-213° C. if starting at 230° C. The mixture is reheated to a temperature of at least about 270° C., e.g. 300° C., within about 15-30 min to produce alloy nanocrystals. The flask is then rapidly cooled with compressed air to about 100° C. and freshly distilled toluene is added (e.g. at least about 3 mL or about 10 mL). Then, at least about 3 mL, e.g. about 10 mL, of freshly distilled methanol is added, followed by centrifugation to precipitate the alloy QDs. The supernatant is discarded and the particle precipitate is purified by dispersing in toluene and subsequent precipitation with methanol 1-3 or more times under ambient conditions (i.e. at room temperature).

The Example describes the successful production of narrowly disperse, direct-gap $Ge_{1-x}Sn_x$ alloy QDs with wide tunability of Sn compositions (0-20.6%) and composition-tunable near IR absorption and intense PL. As the Sn composition increases, the particle size increases while the energy gap and PL peak position decrease. The lattice parameters computed from PXRD analysis indicate near linear expansion of diamond cubic Ge structure with increasing Sn content, suggesting the formation of strain-free nanoalloys.

Sn alloying of crystalline Si tremendously enhances the absorption cross-section, enabling light harvesting capability over a wide spectral region (2.3-1.7 eV; 540-730 nm).

By manipulating the nucleation and growth kinetics, the synthetic strategy described herein produces phase-pure Group IV alloy QDs with narrow size dispersity (e.g. less than 15%, e.g. 6-15%, e.g. 11-15%) nearly spherical morphology and wider range of Sn compostions (0-20.6%) (FIG. 1). The size and composition of the alloy QDs may be effectively controlled by varying the amount of reducing agent (e.g. n-BuLi) across a range of Sn compositions (e.g. 0.58-0.75 mmol of n-BuLi for x=20.6-1.5%) to equalize the growth effects of Sn. QD size and composition may also be controlled by changing the molar ratio of halides: reducing agent as shown in Table 1 and FIG. 2. The QDs produced by the methods described herein are generally about 3-6 nm in size (FIG. 2A-I).

TABLE 1

The molar ratio of $GeI_2$, $SnCl_2$, and n-BuLi used in the synthesis of 3.3 ± 0.5-5.9 ± 0.8 nm $Ge_{1-x}Sn_x$ (x = 1.5-20.6%) alloy QDs. The total moles of $GeI_2$ and $SnCl_2$ was fixed at 0.6 mmol.

| Sample | $GeI_2$ (mmol) | $SnCl_2$ (mmol) | n-BuLi (mmol) |
|---|---|---|---|
| $Ge_{0.985}Sn_{0.015}$ | 0.591 | 0.0090 | 1.48 |
| $Ge_{0.981}Sn_{0.019}$ | 0.5886 | 0.0114 | 1.46 |
| $Ge_{0.973}Sn_{0.027}$ | 0.5838 | 0.0162 | 1.43 |
| $Ge_{0.966}Sn_{0.034}$ | 0.5796 | 0.0204 | 1.42 |
| $Ge_{0.958}Sn_{0.042}$ | 0.5748 | 0.0252 | 1.40 |
| $Ge_{0.944}Sn_{0.056}$ | 0.5664 | 0.0336 | 1.38 |
| $Ge_{0.936}Sn_{0.064}$ | 0.5619 | 0.0381 | 1.36 |
| $Ge_{0.921}Sn_{0.079}$ | 0.5526 | 0.0474 | 1.34 |
| $Ge_{0.909}Sn_{0.091}$ | 0.5454 | 0.0546 | 1.30 |
| $Ge_{0.888}Sn_{0.112}$ | 0.5328 | 0.0672 | 1.25 |
| $Ge_{0.846}Sn_{0.154}$ | 0.5076 | 0.0924 | 1.20 |
| $Ge_{0.794}Sn_{0.206}$ | 0.4764 | 0.1236 | 1.16 |

Figure 11A:
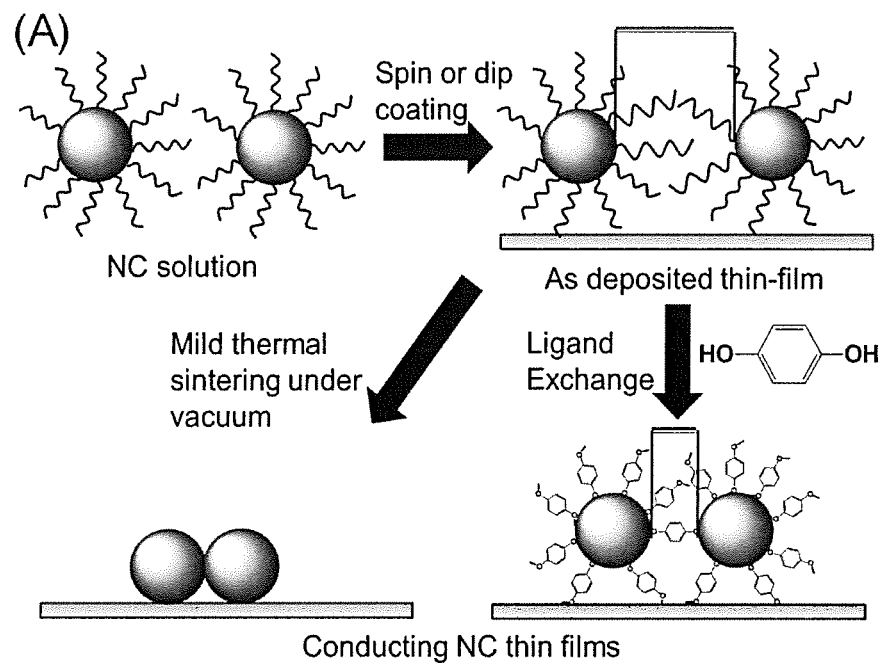
FIGS. 11A-B. Fabrication of densely-packed QD thin film solar cells using spin-coating methods. (A) shows ligand exchange with electroactive surfactants for enhanced photo-/electrical-conductivity. (B) shows ligand exchange with molecular metal chalcogenides (MCC) for electronic-grade QD films.
Figure 11B:
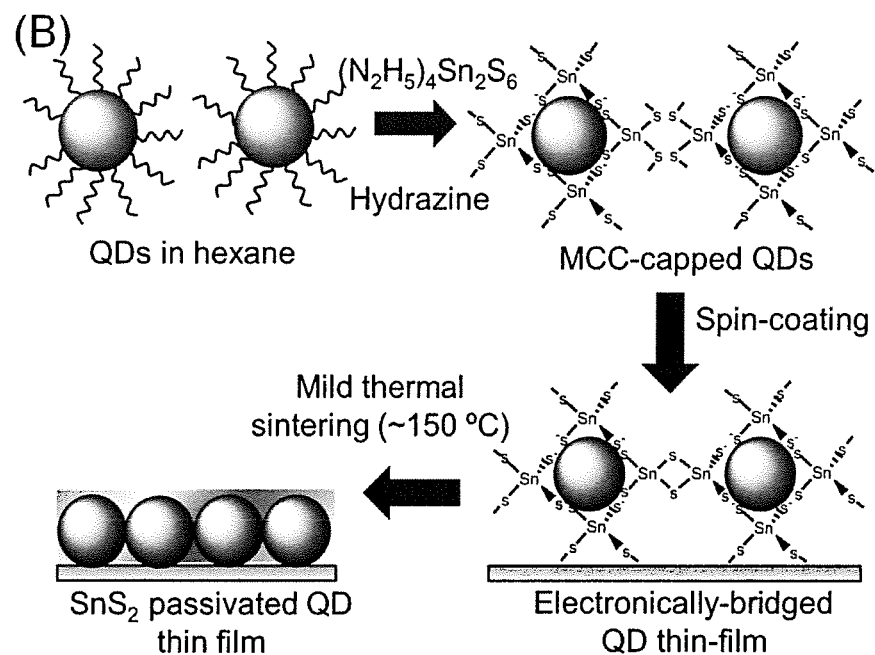

The QDs prepared by methods as disclosed herein may be used in transistors, solar cells, light emitting diodes, optical detectors, sensors, diode lasers (e.g. nanophotonic applications) and second-harmonic generation, quantum computing, and medical imaging. Their small size allows for the QDs to be suspended in solution, which is useful for inkjet printing and spin-coating (FIGS. 11A-B). QDs may also be deposited as dense-packed, highly conducting thin films for integration into optoelectronic devices. Such thin films may be about 1-30 nm in thickness. These processing techniques result in less expensive and less time-consuming methods of semiconductor thin flim fabrication.

Figure 12:
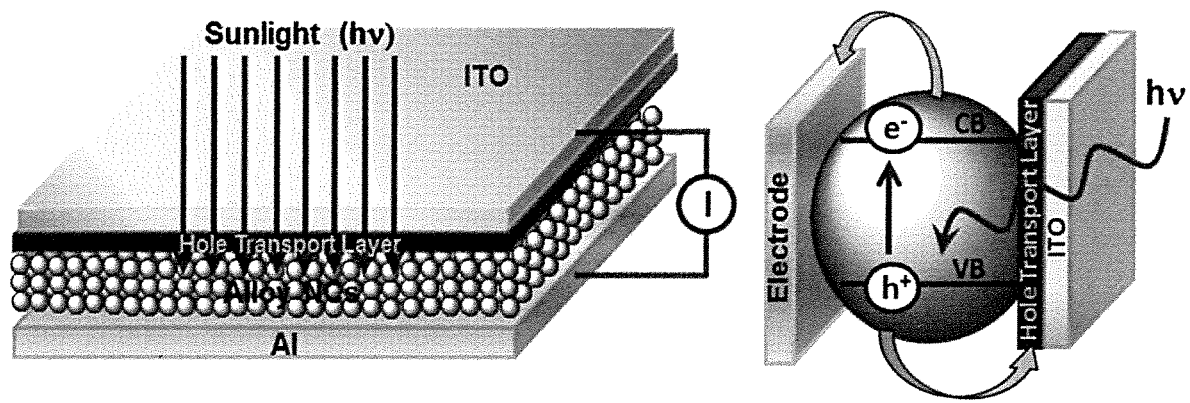
FIG. 12. A photovoltaic device according to some embodiments of the disclosure. VB=valence band, CB=conduction band, Al=aluminum, and ITO=indium tin oxide.

With reference to FIG. 12, an exemplary QD solar cell converts light into electricity by the photovoltaic effect. To fabricate solar cells, QDs may be deposited into densely packed thin films on transparent conducting substrates (such as Indium Tin Oxide, ITO). The alloy QDs produced by methods described herein offer greater flexibility in designing PV devices with enhanced solar energy capture over a wide spectral region by multi-step coating of similar-sized, yet differently alloyed QD compositions (QDs showing different energy-gaps across the solar spectrum, 720-1050 nm). However, to optimize the efficiency of PVs (i.e. charge separation), it must be demonstrated that the QD emission can be quenched by effective extraction of the electron and hole from the core of the particles. Densely packed QD films may demonstrate radiative recombination (photoluminescence) of the photo-excited electron and hole, due to difficulties in extracting electrons from the nanocrystals. To minimize this, a hole-accepting (or an electron-donating) polymer may be incorporated to fabricate QD/polymer thin film composites (FIG. 12). Based on studies of such composites, compatible polymers include poly-3(hexylthiophene) and poly-phenylenevinylene (PPV) based materials, such as poly[2-methoxy-5-(2'-ethyl-hexyloxy-p-phenlenevinylene], both of which are commercially available. The best performing QD/hole transport polymer composite films or bare QD thin films may be employed in the PV devices. Additionally, sputtered Au or Al electrical contacts may be deposited to complete the PV cell, as illustrated in FIG. 12. The electrical circuit is then completed through the use of a liquid or solid redox couple. The electrode opposite the conducting film may be, for example, aluminum, gold, silver, magnesium, or other metal, calcium, or calcium encapsulated by a metal.

Solar cell efficiency may be calculated using the following equation: $(\eta)=P_{max}/(EA)$, where $P_{max}$=the maximum power input in W, E=input light intensity in W/m$^2$ and A=surface area of the PV device in m$^2$. The fabricated PV cells may also be tested to investigate the standard PV cell parameters (such as Open circuit voltage (Voc), Short circuit current density (Jsc), Fill factor and current density at maximum power), following procedures known in the art.

The colloidal synthesis described herein has expanded the optical window of direct-gap Group IV alloy QDs into near IR spectrum allowing non-toxic, earth abundant, and silicon-compatible Group IV elements for application in a broad range of electronic and photonic technologies. QD nanocrystals deposited as thin films using low-cost solution based processing methods (e.g. spin-coating) allows for a host of new device configurations while their absorption and emission profiles can be tuned by changing the size or composition to meet the specific needs of a desired technology.

Before exemplary embodiments of the present invention are described in greater detail, it is to be understood that this invention is not limited to particular embodiments described, as such may, of course, vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limit of that range and any other stated or intervening value in that stated range, is encompassed within the invention. The upper and lower limits of these smaller ranges may independently be included in the smaller ranges and are also encompassed within the invention, subject to any specifically excluded limit in the stated range. Where the stated range includes one or both of the limits, ranges excluding either or both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can also be used in the practice or testing of the present invention, representative illustrative methods and materials are now described.

All publications and patents cited in this specification are herein incorporated by reference as if each individual publication or patent were specifically and individually indicated to be incorporated by reference and are incorporated herein by reference to disclose and describe the methods and/or materials in connection with which the publications are cited. The citation of any publication is for its disclosure prior to the filing date and should not be construed as an admission that the present invention is not entitled to antedate such publication by virtue of prior invention. Further, the dates of publication provided may be different from the actual publication dates which may need to be independently confirmed.

It is noted that, as used herein and in the appended claims, the singular forms "a", "an", and "the" include plural referents unless the context clearly dictates otherwise. It is further noted that the claims may be drafted to exclude any optional element. As such, this statement is intended to serve as antecedent basis for use of such exclusive terminology as "solely," "only" and the like in connection with the recitation of claim elements, or use of a "negative" limitation.

As will be apparent to those of skill in the art upon reading this disclosure, each of the individual embodiments described and illustrated herein has discrete components and features which may be readily separated from or combined with the features of any of the other several embodiments without departing from the scope or spirit of the present invention. Any recited method can be carried out in the order of events recited or in any other order which is logically possible.

The invention is further described by the following non-limiting examples which further illustrate the invention, and are not intended, nor should they be interpreted to, limit the scope of the invention.

EXAMPLE

Summary

Admixing of α-Sn into Ge results in an indirect-to-direct bandgap crossover significantly improving light absorption and emission relative to indirect-gap Ge. However, the narrow energy-gaps reported for bulk $Ge_{1-x}Sn_x$ alloys have become a major impediment for their widespread application in optoelectronics. Described herein is the first colloidal synthesis of $Ge_{1-x}Sn_x$ alloy quantum dots (QDs) with narrow size dispersity (3.3±0.5-5.9±0.8 nm), wide range of Sn compositions (0-20.6%), and composition-tunable energy-gaps and near infrared (IR) photoluminescence (PL). The structural analysis of alloy QDs indicates linear expansion of cubic Ge lattice with increasing Sn, suggesting the formation of strain-free nanoalloys. The successful incorporation of α-Sn into crystalline Ge has been confirmed by electron microscopy, which suggests the homogeneous solid solution behavior of QDs. The quantum confinement effects have resulted in energy gaps that are significantly blue-shifted from bulk Ge for $Ge_{1-x}Sn_x$ alloy QDs with composition-tunable absorption onsets (1.72-0.84 eV for x=1.5-20.6%) and PL peaks (1.62-1.31 eV for x=1.5-5.6%). Time-resolved PL (TRPL) spectroscopy revealed microsecond and nanosecond timescale decays at 15 K and 295 K, respectively owing to radiative recombination of dark and bright excitons as well as the interplay of surface traps and core electronic states. Realization of low-to-non-toxic and silicon-compatible $Ge_{1-x}Sn_x$ QDs with composition-tunable near IR PL allows the unprecedented expansion of direct-gap Group IV semiconductors to a wide range of biomedical and advanced technological studies.

Materials and Methods

Materials. Germanium diiodide (99.99+%) and tin dichloride (99.9985%) were purchased from Strem Chemicals and Alfa Aesar, respectively. n-butyllithium (BuLi, 1.6 M in hexane) was purchased from Sigma Aldrich. 1-octadecene (ODE, 90%) was purchased from Fisher Scientific. 1-Hexadecylamine (HDA), toluene, $CCl_4$, and methanol of ACS grade were purchased from Acros. ODE was dried at 120° C. under vacuum for 1 h. Methanol and toluene were dried over molecular sieves and Na, respectively and distilled under $N_2$ prior to use.

Synthesis of $Ge_{1-x}Sn_x$ Alloy QDs. In a typical synthesis of 3-6 nm QDs, 3.00 g of HDA in a 50 mL three neck round bottom flask was fitted with a condenser and degassed under vacuum at 115° C. for 1 h. This set up was cooled to room temperature and transferred to a nitrogen glovebox. Then, appropriate amounts of $GeI_2$ and $SnCl_2$, 0.6 mmol of metal total, were combined with HDA and the sealed set up was connected to a Schlenk line. This mixture was degassed at 115° C. for 1 h to produce a homogeneous orange color solution. Then the reaction was flushed with nitrogen for 15 min and the temperature was raised to 230° C., at which point 1.16-1.48 mmol of BuLi in 3.0 mL of ODE was swiftly injected. The injection caused a temperature drop to 209-213° C. and the mixture was reheated to 300° C. within 15 min to produce $Ge_{1-x}Sn_x$ alloy QDs. The flask was then rapidly cooled with compressed air to 100° C. and 10 mL of freshly distilled toluene was added. Then, 10 mL of freshly distilled methanol was added, followed by centrifugation at 4000 g to precipitate the alloy QDs. The supernatant was discarded and the QD precipitate was purified by dispersing in toluene and subsequent precipitation with methanol 2-3 times under ambient conditions.

Physical Characterization. The powder X-ray diffraction (PXRD) patterns were recorded using a PANanalytical X'pert PRO diffractometer calibrated with Si standard and equipped with Cu Kα (λ=1.5418 Å) radiation. Crystallite sizes were estimated by applying the Scherrer formula[29] to (111), (220), and (311) reflections of cubic Ge. Raman spectra were recorded on powder samples using a Horiba LABram HR Evolution Confocal Raman Spectrometer equipped with a 532 nm laser. The solid-state reflectance and solution-state absorption measurements were performed on a Cary 6000i UV-visible-near IR spectrophotometer (Agilent Technologies). Solid-state diffuse reflectance spectra were recorded by mixing QDs thoroughly with $BaSO_4$ powder and spreading them evenly on a $BaSO_4$ background holder. Kubelka-Munk remission function was employed to convert the measured reflectance to absorption.[30] The energy gaps were estimated from the intersection point of absorption onsets and the baseline of the absorption spectrum. A frequency doubled Ti: sapphire laser (385 nm wavelength, 150 fs pulse width, and 160 kHz to 80 MHz repetition rate) was utilized as the excitation source to record steady-state PL and TRPL spectra of QDs dispersed in $CCl_4$ as well as those drop-casted onto clean Si substrates. The elemental analysis was performed using a Hitachi FE-SEM Su-70 model scanning electron microscope (SEM) equipped with an energy dispersive spectroscopy (EDS) unit operating at 20 keV. Low resolution transmission electron microscopy (LRTEM) images were recorded on a JEOL JEM-1400 model microscope operating at 120 kV. High-resolution TEM (HRTEM) and Scanning TEM-energy dispersive spectroscopy (STEM-EDS) images were recorded on a FEI Titan 8300 microscope equipped with a Gatan 794 multiscan camera operating at 300 kV. Samples for TEM analysis were prepared by drop casting ~5 μL, of alloy QDs dispersed in hexane onto carbon-coated copper grids, followed by evaporation of the solvent. X-ray photoelectron (XPS) spectra were acquired on a Thermofisher ESCALAB™ 250 instrument using Al Kα radiation. XPS samples were prepared by pressing the powder samples onto indium foil (Sigma-Aldrich) prior to analysis. Sample surface charging was corrected to adventitious carbon and peak fits were performed with Thermo Advantage software. The infrared spectra of alloy QDs were recorded using a Nicolet 670 Fourier transform infrared (FT-IR) instrument equipped with a single reflection diamond ATR attachment.

Results and Discussion

The lattice mismatch between Ge and Sn (~14%) causes a great challenge to produce homogeneous $Ge_{1-x}Sn_x$ alloys.[11,19] Because of its covalent bonding nature Ge requires high temperature (300-400° C.) to crystallize whereas Sn melts above 231° C.[31-33] Hence these two elements are poorly miscible (~1% equilibrium solubility of Sn in bulk Ge) in the solid state. With consideration of aforementioned complications, we have developed a unique synthetic strategy to produce 3.3±0.5-5.9±0.8 nm $Ge_{1-x}Sn_x$ alloy QDs with Sn content up to 20.6%. Colloidal synthesis provides a unique platform to incorporate significant Sn into Ge without altering its diamond cubic structure and simultaneously expanding the energy gaps owing to unique size confinement effects. Previous wet-chemical reports utilized oleylamine/octadecene as the surfactant/solvent and constant amount of reducing agent (n-butyllithium, BuLi) to produce 3.4-4.6 nm $Ge_{1-x}Sn_x$ alloy QDs.[20] However, the fixed amount of n-BuLi resulted in minimum control over nanocrystal size (size dispersity=15-25% for x=0.0-11.0%) because Sn promotes the growth of larger polydisperse QDs.[20] Herein, by manipulating the nucleation and growth kinetics, a modified synthetic strategy has been developed to produce phase-pure $Ge_{1-x}Sn_x$ alloy QDs with narrow size dispersity (11-15%) and nearly spherical morphology (FIG. 1). The size and composition of the alloy QDs were effectively controlled by varying the amount of n-BuLi across wide a range of Sn compositions (0.58-0.75 mmol of n-BuLi for x=20.6-1.5%) to equalize the growth effects of Sn.

Powder X-ray diffraction (PXRD) patterns of $Ge_{1-x}Sn_x$ alloy QDs indicate the phase purity of particles and Bragg reflections corresponding to diamond cubic Ge structure (FIG. 3A). No diffraction peaks corresponding to $GeO_2$, α-Sn, or β-Sn (tetragonal Sn) impurity phases were detected suggesting the production of homogeneous alloys. The major diffraction peaks were indexed to (111), (220), and (311) planes of diamond-cubic Ge (JCPDS #01-089-5011). The peak broadening is quite significant as a result of Scherrer scattering, consistent with the synthesis of nanoalloys.[29] The crystallite sizes computed using Scherrer formula are in the range of 2.01±0.2-3.82±0.2 nm for x=1.5-20.6%. With increasing Sn, diffraction patterns shift to lower 2θ angles owing to expansion of cubic Ge structure by α-Sn. Unlike the bulk lattice constants, which show significant bowing, average lattice parameters calculated from diffraction patterns indicate near linear expansion of the cubic Ge structure with increasing Sn, consistent with the Vegard's rule (FIG. 3B).[34] Lattice constants for cubic Ge and α-Sn are 5.66 and 6.49 Å, respectively. In contrast, as-synthesized alloy QDs exhibit intermediate lattice parameters of 5.64-5.85 Å, further supporting the synthesis of strainfree, homogeneous nanoalloys.

Raman spectroscopy was utilized to further study the alloying effects in $Ge_{1-x}Sn_x$ QDs. Crystalline Ge exhibits a Raman peak at 300 $cm^{-1}$ that corresponds to the optical phonon mode of Ge—Ge bonds.[35] As heavier Sn atoms are incorporated into the Ge crystal, a systematic red shift of Ge—Ge phonon mode is expected.[35] Nonetheless, single element Ge QDs exhibit a broad, red shifted GeGe peak at 297-300 $cm^{-1}$ owing to phonon confinement effects.[24,36] Therefore, the combined effects of phonon confinement and Sn induced shifting cannot be distinguished preventing quantification of Sn-induced expansion effects in the alloy. However, a systematic red shift of the Ge—Ge phonon mode (295-287 $cm^{-1}$ for x=0.000-0.206) with increasing heavier Sn atoms is observed for 3.3±0.5-5.9±0.8 nm alloy QDs, consistent with the weakening (or lengthening) of the Ge—Ge bond and lattice constants computed from Vegard's law (FIG. 3B). The broadening of Ge—Ge peak is consistent with the increased alloy disorder and size confinement effects.21,37

Figures 4F, 5A:
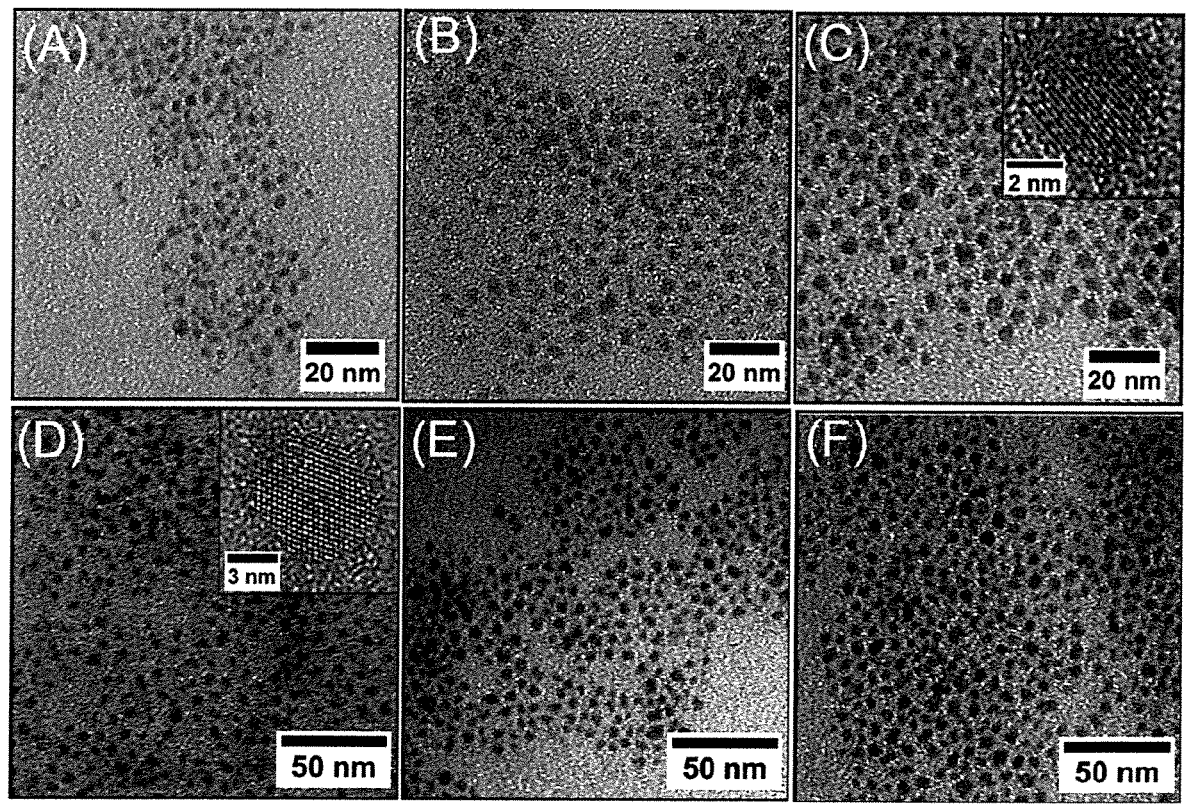

TEM was used to investigate the morphology and size dispersity of alloy QDs. The LRTEM images of as-synthesized particles show narrow size dispersity (3.3±0.5-5.9±0.8 nm) and near spherical morphology across varying Sn compositions (FIG. 5AF). No size selective precipitation steps were employed during the isolation and purification of samples. A slight increase in particle size with increasing Sn composition was noted possibly due to Sn-induced growth of QDs.[20] The narrow size distribution of as-synthesized QDs was confirmed through size analysis of 150-200 particles across multiple individually prepared samples, which yields dispersity of 11-15%. In contrast, prior reports of 3.4±0.4-4.6±1.2 nm $Ge_{1-x}Sn_x$ alloy QDs, produced in oleylamine, are reported to exhibit much higher size dispersity of 15-25%. The improved size and size dispersity control may be attributed to strong interaction between $Ge_{1-x}Sn_x$ and HDA, which prevents the growth of larger polydisperse particles. In addition, HRTEM images of $Ge_{1-x}Sn_x$ alloy QDs indicate the single crystalline nature of particles with a lattice spacing of 3.32-3.41 Å for x=2.7-20.6%, consistent with an expanded (111) plane of cubic Ge (3.3 Å). The slight discrepancy in crystallite size estimated from PXRD and averaged particle size obtained from TEM analysis can be attributed to the presence of an amorphous $Ge_{1-x}Sn_x$ layer on the QD surface.

Figures 6A, 6B, 6C, 6D:
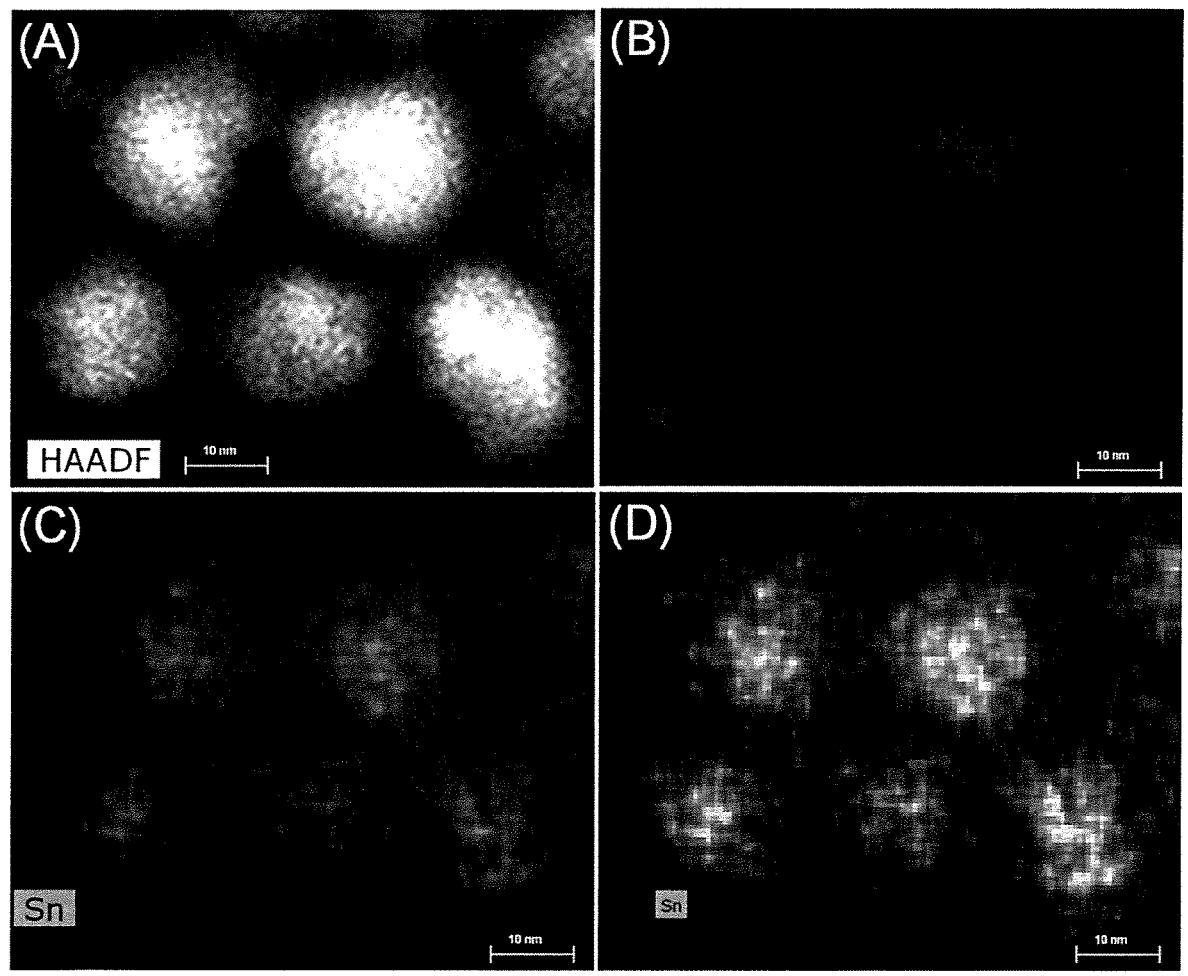
FIGS. 6A-D. (A) Dark field TEM image of 8-20 nm $Ge_{0.888}Sn_{0.112}$ alloy QDs along with STEM/EDS elemental maps of (B) Ge, (C) Sn, and (D) an overlay of Ge and Sn indicating the homogeneous distribution of elemental components throughout the alloy lattice.

High-angle annular dark-field (HAADF) images and STEM-EDS elemental maps were utilized to probe the homogeneous solid solution behavior of $Ge_{1-x}Sn_x$ QDs. Elemental mapping of near IR emitting alloy QDs was difficult due to extremely small size (3.3±0.5-5.9±0.8 nm) and complete destruction of particles is often noted under the high energy beam. Therefore, a set of larger polydisperse (8-20 nm) alloy nanocrystals was produced, by extending the growth temperature (10 min.) at 300° C., solely for STEM-EDS analysis. Elemental maps of 8-20 nm $Ge_{0.888}Sn_{0.112}$ alloy QDs indicate homogeneous distribution of Ge and Sn in the entire crystal, suggesting the solid solution behavior (FIG. 6). Therefore, the smaller near IR emitting alloy QDs, which act as seeds for the growth of larger polydisperse (8-20 nm) particles, should also be homogeneous, consistent with prior reports on colloidally synthesized $Ge_{1-x}Sn_x$ nanoalloys.[17,21,23,25,26] It should be noted while elemental maps were recorded from larger QDs that provide high counts from individual particles, the elemental composition of near IR emitting alloy QDs were obtained from multiple individually prepared 3.3±0.5-5.9±0.8 nm alloy particles and the average values are shown in Table 2.

TABLE 2

Comparison of the Elemental Composition, Crystallite and Primary Particle Size, and Room Temperature Solid-State Absorption Onsets and Photoluminescence Peak maxima for 3.3 ± 0.5-5.9 ± 0.8 nm $Ge_{1-x}Sn_x$ Alloy QDs.

| Sample | Sn Composition (x)[a] | Particle Size (nm)[b] | Crystallite Size[c] (nm) | Energy gap (eV)[d] | PL Peak Position (eV) |
|---|---|---|---|---|---|
| 1 | 0.015 | 3.3 ± 0.5 nm | 1.9 ± 0.2 | 1.72 | 1.62 |
| 2 | 0.019 | 3.4 ± 0.5 nm | 2.1 ± 0.2 | 1.61 | 1.52 |
| 3 | 0.027 | 3.5 ± 0.6 nm | 2.2 ± 0.2 | 1.52 | 1.43 |
| 4 | 0.034 | 3.7 ± 0.5 nm | 2.4 ± 0.2 | 1.48 | 1.38 |
| 5 | 0.042 | 3.9 ± 0.6 nm | 2.8 ± 0.2 | 1.30 | 1.34 |
| 6 | 0.056 | 4.4 ± 0.7 nm | 2.8 ± 0.2 | 1.22 | 1.31 |
| 7 | 0.064 | 4.5 ± 0.6 nm | 2.9 ± 0.2 | 1.02 | n/a[f] |
| 8 | 0.079 | 4.6 ± 0.8 nm | 3.0 ± 0.3 | 0.94 | n/a[f] |
| 9 | 0.091 | 5.0 ± 0.7 nm | 3.3 ± 0.2 | 0.84 | n/a[f] |
| 10 | 0.112 | 5.2 ± 0.6 nm | 3.5 ± 0.3 | n/a[e] | n/a[f] |
| 11 | 0.154 | 5.5 ± 0.8 nm | 3.6 ± 0.3 | n/a[e] | n/a[f] |
| 12 | 0.206 | 5.9 ± 0.8 nm | 3.8 ± 0.2 | n/a[e] | n/a[f] |

[a]Elemental compositions of Ge and Sn were obtained from SEM/EDS analysis of multiple individually prepared samples and the averaged values obtained from 5 individual measurements for each sample are presented.
[b]Average particle sizes were calculated from 150-200 individual QDs from TEM images of multiple individually prepared samples.
[c]Crystallite sizes were calculated by applying the Scherrer formula to (111), (220), and (311) reflections of PXRD patterns and average values are presented.
[d]Energy gaps were estimated from extrapolating the first major absorption onset to the intersection point of the baseline using linear fits.
[e]Onset cut off due to detector limitation.
[f]No detectable PL was noted.

Figures 7A, 7B:
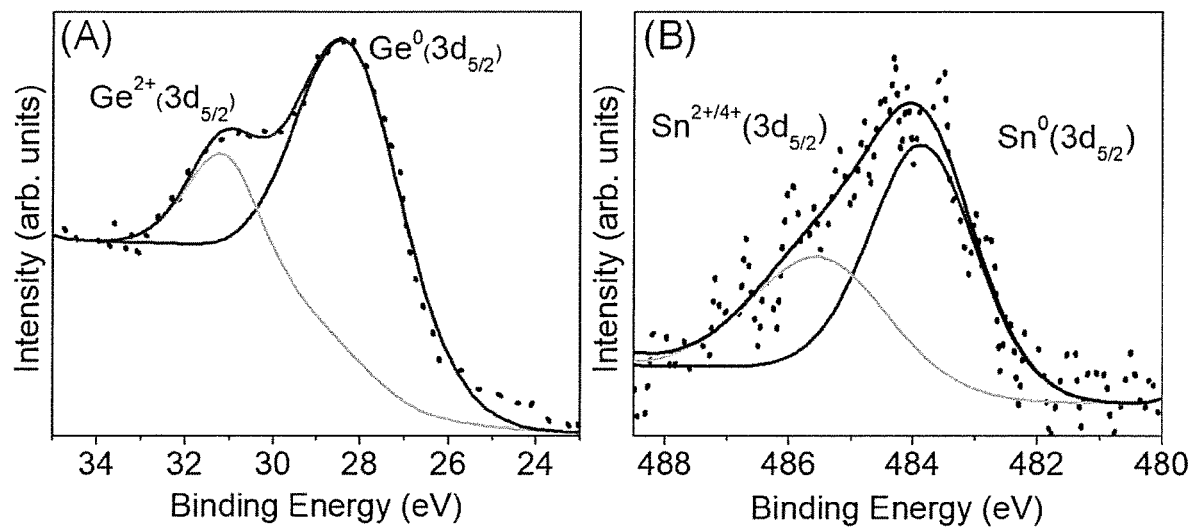
FIGS. 7A-B. Representative (A) Ge ($3d_{5/2}$) and (B) Sn ($3d_{5/2}$) XPS spectra of $Ge_{0.888}Sn_{0.112}$ alloy QDs. Dotted lines represent the spectral data and the solid lower lines are fitted deconvolutions of core $Ge^0/Sn^0$ and different oxidation states ($Ge^{2+}$, $Sn^{2+}$ and $Sn^{4+}$) of surface species, respectively. The top solid lines are spectral envelopes.

The binding energies of Ge and Sn obtained from XPS spectra are consistent with prior reports of $Ge_{1-x}Sn_x$ nanoalloys (FIG. 7).[20,21] The survey XPS spectra exhibit peaks corresponding to Ge, Sn, C, and O with no other impurities, consistent with the EDS analysis. The peak at 28.4 eV in the $Ge\ 3d_{5/2}$ spectra can be attributed to Ge(0), which has been shifted from the expected value of 29.4 eV, likely due to surface charging effects.[38] The peak at 31.2 eV is likely arising from surface $Ge^{2+}$ species coordinated to alkylamine and alkene passivating ligands.[20,23] Consistent with XPS data, FTIR spectra of alloy QDs indicates the presence of HDA on QD surface. Occasionally, a minor peak at 34.0 eV is observed in $Ge\ 3d_{5/2}$ spectra, which can be attributed to $Ge^{4+}$ likely produced by surface oxidation. The examination of the $Sn\ (3d_{5/2})$ region indicates similar behavior with both core $Sn^0$ (483.9 eV) and surface $Sn^{2+/4+}$ (485.6 eV) species bound to stabilizing ligands.20,23,39,40 It is important to note that no $GeO_x$ or $SnO_x$ impurities were detected in PXRD and Raman spectra of QDs (FIGS. 3A and 4A). However, the presence of higher oxidation state peaks (i.e. $Ge^{4+}$ and $Sn^{4+}$ in particular) can also be attributed to minor oxide impurities produced via surface oxidation.[20,21,23] Nonetheless, similar core and surface species were noted in Ge (3d and 2P) and Sn (3d) spectra of alloy QDs with varying Sn compositions, consistent with prior reports of $Ge_{1-x}Sn_x$ nanoalloys.[20,21,23]

Figure 8:
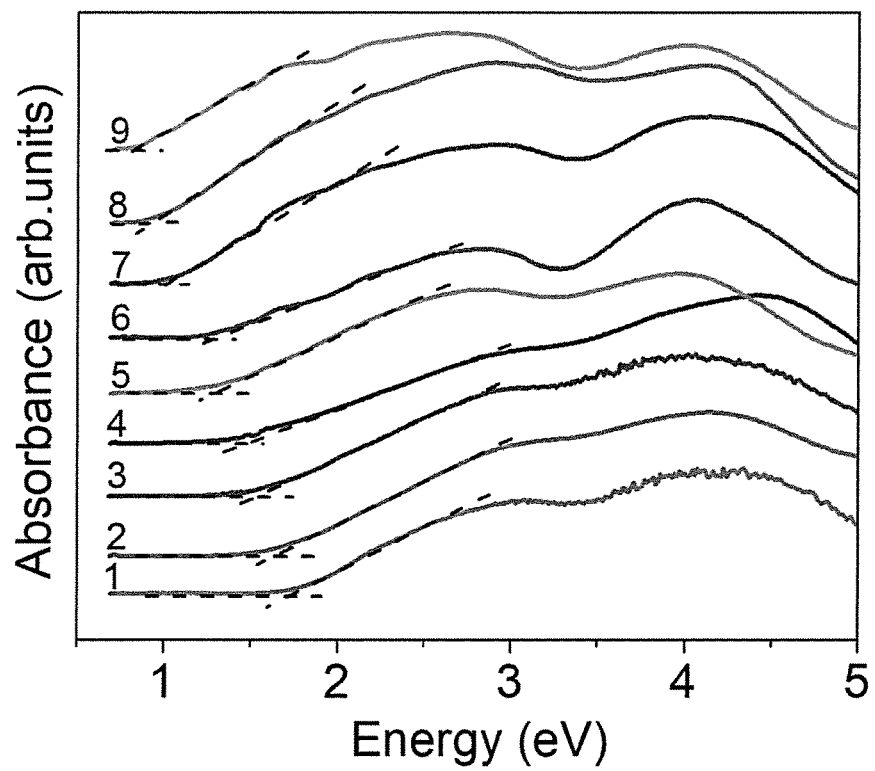
FIG. 8. Solid state diffuse reflectance spectra (converted to absorption using Kubelka-Munk remission function) of $Ge_{1-x}Sn_x$ alloy QDs with varying Sn composition: (1) x=1.5% (1.72 eV), (2) x=1.9% (1.61 eV), (3) x=2.7% (1.52 eV), (4) x=3.4% (1.48 eV), (5) x=4.2% (1.30 eV), (6) x=5.6% (1.22 eV), (7) x=6.4% (1.02 eV), (8) x=7.9% (0.94 eV), and (9) x=9.1% (0.84 eV). Corresponding absorption onset values are shown in parentheses.

Solid state diffuse reflectance (converted to absorption) spectroscopy was utilized to probe the absorption onsets of alloy QDs and effects of size confinement. The energy gaps obtained from Kubelka Munk[30] analysis indicate strong quantum confinement effects in 3.3±0.5-5.0±0.7 nm $Ge_{1-x}Sn_x$ QDs with well-defined absorption onsets from 1.72-0.84 eV for x=1.5-9.1% compositions (FIG. 8). A clear red-shift in absorption onset is noted with increasing Sn content for QDs with similar average size, consistent with Sn induced lowering of energy gaps. The solid-state energy gaps of alloy QDs with higher Sn content (x>9.1%) could not be probed because of the instrumental limitations. Thus, solution absorption spectra were recorded to estimate the energy gaps over a wide range of Sn compositions (0-20.6%). Typical solution absorption spectra of $Ge_{1-x}Sn_x$ alloy QDs (x=1.5-20.6%) exhibit no excitonic peaks, consistent with prior reports on Ge and $Ge_{1-x}Sn_x$ QDs.[20,23] However, the solution phase energy gaps estimated using Tauc function,[1,23,30,41-43] yield values from 2.05-0.90 eV for x=1.5-20.6% compositions. However, the energy gaps obtained from solid-state absorption spectra (KubelkaMunk analysis) are in close agreement with the gap energies estimated from PL measurements (FIG. 9 and Table 2). It should also be noted that both solid-state and solution-state energy gaps of $Ge_{1-x}Sn_x$ alloy QDs are significantly larger than those reported for bulk $Ge_{1-x}Sn_x$ thin film alloys (0.35-0.80 eV for x=15.0-0.00%),[19] consistent with the expected quantum confinement effects.

Solid-state emission spectra of $Ge_{1-x}Sn_x$ alloy QDs exhibit composition tunable PL peak energies in the near IR spectrum (1.62-1.31 eV for x=0.015-0.056, FIG. 9). Consistent with absorption studies, a clear red shift in PL maxima was noted with increasing Sn composition. The PL peak energies are red shifted from those reported for ultrasmall (1.8-2.2 nm) $Ge_{1-x}Sn_x$ alloy QDs (2.0-1.72 eV for x=1.8-23.6%), owing to larger particles produced in the current study.[21,22] It is important to note that this is the first report on tunable near IR emitting $Ge_{1-x}Sn_x$ alloy QDs with wide range of Sn compositions. Previous studies on 6-11 nm $Ge_{1-x}Sn_x$/CdS core/shell QDs with 5 and 25% Sn compositions showed broad-band PL (800-1200 nm) with no tunability as a function of size or composition.[24] Likewise, larger (9-10 nm) $Ge_{1-x}Sn_x$ alloy QDs with high Sn content (x=36-39%) are reported to exhibit broad and weak PL in the deep IR region (~0.45-0.55 eV).[23] In contrast, alloy QDs reported in this study exhibit wide tunability of near IR PL across different Sn compositions. Moreover, the solid-state absorption onsets are in close agreement with the PL peak maxima, suggesting that the PL results from fundamental energy gap transitions. The solution-state PL spectra are slightly weaker than those reordered from solid-state samples because of the lower excitation powder used in solution-state analysis. However, both solution-state and solid-state PL spectra show consistent PL peak maxima with varying excitation energy, suggesting that emission results from inter-band electronic transitions of alloy QDs.[44,45] However, PL from QDs with Sn content higher than 5.6% could not be probed possibly due to poor surface passivation and/or weaker confinement effects, resulting in higher degree of non-radiative recombination. Different surface passivation strategies may be used to eliminate surface defects, enhanced the PL efficiency, and improve the chemical and optical stability of QDs with higher Sn compositions.

To investigate carrier relaxation pathways and further understand the origin of near IR PL, temperature dependent time-resolved PL experiments were performed. FIG. 10 shows the PL transients measured for $Ge_{1-x}Sn_x$ alloy QDs with x=1.9%, 4.2%, and 5.6% at 295 K and 15 K. All transients are well described by biexponential decay fits, providing fast decay constants of $\tau_{fast}$=8-11.7 ns and slow decay constants of $\tau_{slow}$=80-119 ns at room temperature (295 K, Table 3). In contrast, the PL decays are much slower at 15 K: $\tau_{fast}$=1-1.6 µs, $\tau_{slow}$=7.8-10.8 µs. This drastic difference can be explained by a combined effect of surface trap states and dark-bright exciton splitting in QDs.[21,22] The spin-forbidden dark exciton recombination is slow at 15 K, and increased thermal energy at room temperature makes bright excitonic states accessible, improving the recombination rates. Moreover, slow recombination at 15 K may also be partially due to charge trapping at the surface states, which can lead to long carrier times owing to separation of photoexcited carriers. Nearly an order of magnitude reduction in PL intensities at 295 K compared to those at 15 K suggests a dominant role of nonradiative recombination at increased temperatures.

TABLE 3

Time Constants Extracted from Biexponential Decay Fits
($A_{fast} e^{-t/\tau_{fast}} + A_{slow} e^{-t/\tau_{slow}}$)
to PL Transients of Near IR Emitting $Ge_{1-x}Sn_x$ Alloy QDs.

| @295 K | $\tau_{fast}$ (ns) | $\tau_{slow}$ (ns) | $A_{fast}/A_{slow}$ |
|---|---|---|---|
| x = 0.019 | 8.0 ± 0.2 | 80.2 ± 1.3 | 2.44 |
| x = 0.042 | 11.7 ± 0.8 | 119.1 ± 4.2 | 1.54 |
| x = 0.056 | 11.5 ± 0.6 | 111.1 ± 2.7 | 1.41 |
| @15 K | $\tau_{fast}$ (µs) | $\tau_{slow}$ (µs) | $A_{fast}/A_{slow}$ |
| x = 0.019 | 1.1 ± 0.1 | 7.8 ± 0.4 | 1.64 |
| x = 0.042 | 1.3 ± 0.1 | 10.8 ± 1.1 | 4.27 |
| x = 0.056 | 1.6 ± 0.1 | 8.5 ± 0.2 | 1.78 |

Conclusions

Described herein is the first successful production of narrowly disperse $Ge_{1-x}Sn_x$ alloy QDs with wide tunability of Sn compositions (0-20.6%) and composition-tunable near IR absorption and intense PL. The diameter of alloy QDs was tuned by varying the molar of precursor halides: n-BuLi minimizing the size dispersity to ~11-15%, across varying Sn compositions. The lattice parameters computed from PXRD analysis indicate near linear expansion of diamond cubic Ge structure with increasing Sn content, suggesting the formation of strain-free nanoalloys. The successful incorporation of α-Sn into cubic Ge has been further confirmed by PXRD patterns, STEM-EDS elemental maps, and Raman spectroscopy studies. The quantum confinement effects have resulted in energy gaps that are significantly blue-shifted from bulk $Ge_{1-x}Sn_x$ thin film counterparts for alloy QDs with composition-tunable absorption onsets (1.72-0.84 eV for x=1.5-20.6%) and PL maxima (1.62-1.31 eV for x=1.5-5.6%) primarily in the near IR spectrum. The temperature dependent TRPL spectroscopy suggests microsecond and nanosecond PL decays at 15 K and 295 K, respectively owing to radiative recombination of dark and bright excitons and carriers trapped at surface states. The colloidal synthesis reported here has expanded the optical window of direct-gap $Ge_{1-x}Sn_x$ alloy QDs into near IR spectrum allowing less-toxic, earth abundant, and silicon-compatible Group IV elements for application in a broad range of electronic and photonic technologies.

REFERENCES

1. D. A. Ruddy, J. C. Johnson, E. R. Smith and N. R. Neale, *ACS Nano*, 2010, 4, 7459-7466.
2. A. P. Alivisatos, *Science*, 1996, 271, 933-937.
3. M. C. Beard, K. P. Knutsen, P. Yu, J. M. Luther, Q. Song, W. K. Metzger, R. J. Ellingson and A. J. Nozik, *Nano Lett.*, 2007, 7, 2506-2512.
4. D. D. Vaughn, II. and R. E. Schaak, *Chem. Soc. Rev.*, 2013, 42, 2861-2879.
5. C. Bortug, J. R. Sanchez-Perez, F. Cavallo, M. G. Lagally and R. Paiella, *ACS Nano*, 2014, 8, 3136-3151.
6. D. Nam, D. S. Sukhdeo, S. Gupta, J.-H. Kang, M. L. Brongersma and K. C. Saraswat, *IEEE J. Sel. Topics Quantum Electron.*, 2014, 20, 1500107/1-1500107/7.
7. M. J. Sueess, R. Geiger, R. A. Minamisawa, G. Schiefler, J. Frigerio, D. Chrastina, G. Isella, R. Spolenak, J. Faist and H. Sigg, *Nat. Photonics*, 2013, 7, 466-472.
8. J. Tolle, A. V. G. Chizmeshya, Y.-Y. Fang, J. Kouvetakisa, V. R. D'Costa, C.-W. Hu, J. Menéndez and I. S. T. Tsong, *Appl. Phys. Lett.*, 2006, 89, 231924/1-231924/3.

9. N. Bhargava, M. Coppinger, J. P. Gupta, L. Wielunski and J. Kolodzey, *Appl. Phys. Lett.*, 2013, 103, 041908/1-041908/4.
10. S. Gupta, R. Chen, Y.-C. Huang, Y. Kim, E. Sanchez, J. S. Harris and K. C. Saraswat, *Nano Lett.*, 2013, 13, 3783-3790.
11. S. Gupta, B. Magyari-Koepe, Y. Nishi and K. C. Saraswat, *J. Appl. Phys.*, 2013, 113, 073707/1-073707/7.
12. B. Wang, G. Ouyang, Y. H. Yang and G. W. Yang, *Appl. Phys. Lett.*, 2007, 90, 121905/1-121905/3.
13. R. Chen, H. Lin, Y. Huo, C. Hitzman, T. I. Kamins and J. S. Harris, *Appl. Phys. Lett.*, 2011, 99, 181125/1-181125/3.
14. M.-H. Lee, P.-L. Liu, Y.-A. Hong, Y.-T. Chou, J.-Y. Hong and Y.-J. Siao, *J. Appl. Phys.*, 2013, 113, 063517/1-063517/5.
15. N. Yahyaoui, N. Sfina, J.-L. Lazzari, A. Bournel and M. Said, *J. Appl. Phys.*, 2014, 115, 033109/1-033109/9.
16. L. Liu, R. Liang, J. Wang and J. Xu, *Appl. Phys. Express*, 2015, 8, 031301/1-031301/4.
17. M. S. Seifner, S. Hernandez, J. Bernardi, A. Romano-R and S. Sven Barth, *Chem. Mater.*, 2017, 29, 9802-9813.
18. C. Kittel, Wiley: Hoboken, N.J. 2005, P50.
19. R. Ragan, K. S. Min and H. A. Atwater, *Mater. Sci. Eng.*, 2001, 79, 1937-1940.
20. R. J. A. Esteves, M. Q. Ho and I. U. Arachchige, *Chem. Mater.*, 2015, 27, 1559-1568.
21. R. J. A. Esteves, S. Hafiz, D. O. Demchenko, U. Ozgur and I. U. Arachchige, *Chem. Commun.*, 2016, 52, 11665-11668.
22. S. A. Hafiz, R. J. A. Esteves, D. O. Demchenko, I. U. Arachchige and Ü. Özgür, *J. Phys. Chem. Lett.*, 2016, 7, 3295-3301.
23. K. Ramasamy, P. G. Kotula, A. F. Fidler, M. T. Brumbach, J. M. Pietryga and S. A. Ivanov, *Chem. Mater.*, 2015, 27, 4640-4649.
24. B. W. Boote, L. Men, H. P. Andaraarachchi, U. Bhattacharjee, J. W. Petrich, J. Vela and E. A. Smith, *Chem. Mater.*, 2017, 29, 6012-6021.
25. M. S. Seifner, F. Biegger, A. Lugstein, J. Bernardi and S. Barth, *Chem. Mater.*, 2015, 27, 6125-6130.
26. S. Barth, M. S. Seifnera and J. Bernardib, *Chem. Commun.*, 2015, 51, 12282-12285.
27. S. Biswas, J. Doherty, D. Saladukha, Q. Ramasse, D. Majumdar, M. Upmanyu, A. Singha, T. Ochalski, M. A. Morris and J. D. Holmes, *Nat. Commun.*, 2016, 7, 11405/1-11405/5.
28. D. O. Demchenko, V. Tallapally, R. J. A. Esteves, S. Hafiz, T. A. Nakagawara, I. U. Arachchige and Ü. Özgür, *J. Phys. Chem. C*, 2017, 121, 18299-18306.
29. H. Borchert, E. V. Shevehenko, A. Robert, I. Mekis, A. Kornowski, G. Grubel and H. Weller, *Langmuir*, 2005, 21, 1931-1936.
30. M. Nowak, B. Kauch and P. Szperlich, *Rev. Sci. Instrum*, 2009, 80, 046107/1-046107/3.
31. K. Tabatabaei, H. Lu, B. M. Nolan, X. Cen, C. E. McCold, X. Zhang, R. L. Brutchey, K. V. Benthem, J. Hihath and S. M. Kauzlarich, *Chem. Mater.*, 2017, 29, 7353-7363.
32. S. R. Herd, P. Chaudhari and M. H. Brodsky, *J. Non-Cryst. Solids*, 1972, 7, 309-327.
33. D. D. Vaughn II, J. F. Bondi and R. E. Schaak, *Chem. Mater.*, 2010, 22, 6103-6108.
34. A. V. G. Chizmeshya, M. R. Bauer and J. Kouvetakis, *Chem. Mater.*, 2003, 15, 2511-2519.
35. V. A. Volodin, D. V. Marin, V. A. Sachkov, E. B. Gorokhov, H. Rinnert and M. Vergnat, *J. Exp. Theor. Phys.*, 2014, 118, 65-71.
36. K. S. Oh, K.-W. Yang, H. T. Kim, H. Lee, J. C. Lee and Y.-S. Sohn, *J. Nanoelectron. Optoelectron.*, 2013, 8, 571-574.
37. A. Tsuge, Y. Uwamino, T. Ishizuka and K. Suzuki, *Appl. Spectrosc.*, 1991, 45, 1377-1380.
38. K. K. Kalebaila, D. G. Georgiev and S. L. Brock, *J. Non-Cryst. Solids*, 2006, 352, 232-240.
39. D. Devaiah, T. Tsuzuki, T. Boningari, P. G. Smirniotisc and B. M. Reddy, *RSC Adv.*, 2015, 5, 30275-30285
40. V. Tallapally, R. J. A. Esteves, L. Nahar and I. U. Arachchige, *Chem. Mater.*, 2016, 28, 5406-5414.
41. J. Tauc, R. Grigorovici and A. Vancu, *Phys. Status Solidi*, 1966, 15, 627-637.
42. A. J. Biacchi, D. D. Vaughn and R. E. Schaak, *J. Am. Chem. Soc.*, 2013, 135, 11634-11644.
43. S. Ganguly, N. Kazem, C. Danielle and S. M. Kauzlarich, *J. Am. Chem. Soc.*, 2014, 136, 1296-1299.
44. J. Hoy, P. J. Morrison, L. K.Steinberg, W. E. Buhro, R. A. Loomis, *J. Phys. Chem. Lett.*, 2013, 4, 2053-2060.
45. P. Xiao, J. Lou, H. Zhang, W. Song, X.-L. Wu, H. Lin, J. Chen, S. Liuc, X. Wang, *Catal. Sci. Technol.*, 2018, 8, 201-209.

While the invention has been described in terms of its preferred embodiments, those skilled in the art will recognize that the invention can be practiced with modification within the spirit and scope of the appended claims. Accordingly, the present invention should not be limited to the embodiments as described above, but should further include all modifications and equivalents thereof within the spirit and scope of the description provided herein.

We claim:

1. A method of forming quantum dots comprising an alloy of germanium (Ge) or silicon (Si) and tin (Sn), comprising the steps of:
   reacting a halide precursor of Ge or Si with a halide precursor of Sn in the presence of hexadecylamine surfactant and a solvent to produce a solution comprising a complex between Ge or Si and Sn,
   adding a pre-determined amount of n-butyllithium reducing agent to the solution, wherein 1.16-1.48 mmol of the reducing agent is added to achieve desired quantum dot sizes, size dispersity, and Sn compositions, and
   heating the solution to a temperature suitable to form said quantum dots.

2. The method of claim 1, wherein a size of the quantum dots is determined by varying the amount of reducing agent and the concentration of Sn.

3. The method of claim 1, wherein the halide precursor of Ge or Si is $GeI_2$ or $SiI_4$.

4. The method of claim 1, wherein the halide precursor of Sn is $SnCl_2$.

5. The method of claim 1, wherein the solvent is an alkene or alkylamine.

6. The method of claim 5, wherein the solvent is octadecene.

7. The method of claim 1, wherein prior to the reacting step, the solvent is pre-heated to a temperature of at least 115° C. for at least one hour and then cooled to room temperature.

8. The method of claim 1, wherein said step of reacting is carried out at a temperature of at least 115° C. for at least one hour.

9. The method of claim 1, wherein the solution is heated to at least 230° C. prior to the adding step.

10. The method of claim 1, wherein the temperature suitable to form quantum dots is at least 300° C.

11. The method of claim 1, further comprising the step of recovering the quantum dots by methanol precipitation.

12. Quantum dots formed by the method according to claim 1.

13. The quantum dots of claim 12, wherein said quantum dots are 3-6 nm in size and have a size dispersity of 11-15%.

14. The quantum dots of claim 12, wherein said quantum dots have a Sn composition from 1.5-20.6%.

15. The quantum dots of claim 12, wherein said quantum dots have composition-tunable absorption onsets of 1.72-0.84 eV and photoluminescence peaks of 1.62-1.31 eV.

16. A nanocrystal thin film comprising the quantum dots of claim 12.

* * * * *